United States Patent
Enyama et al.

(10) Patent No.: US 12,057,288 B2
(45) Date of Patent: Aug. 6, 2024

(54) CHARGED PARTICLE BEAM DEVICE AND INSPECTION METHOD

(71) Applicant: Hitachi High-Tech Corporation, Tokyo (JP)

(72) Inventors: Momoyo Enyama, Tokyo (JP); Makoto Sakakibara, Tokyo (JP); Hajime Kawano, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 349 days.

(21) Appl. No.: 17/642,165

(22) PCT Filed: Oct. 4, 2019

(86) PCT No.: PCT/JP2019/039369
§ 371 (c)(1),
(2) Date: Mar. 10, 2022

(87) PCT Pub. No.: WO2021/065006
PCT Pub. Date: Apr. 8, 2021

(65) Prior Publication Data
US 2022/0328279 A1 Oct. 13, 2022

(51) Int. Cl.
*H01J 37/10* (2006.01)
*H01J 37/147* (2006.01)
(Continued)

(52) U.S. Cl.
CPC .............. *H01J 37/20* (2013.01); *H01J 37/10* (2013.01); *H01J 37/1474* (2013.01);
(Continued)

(58) Field of Classification Search
CPC ...... H01J 37/10; H01J 37/1474; H01J 37/153; H01J 37/244; H01J 37/28; H01J 2237/1536; H01J 2237/2448; H01J 2237/2806
See application file for complete search history.

(56) References Cited

U.S. PATENT DOCUMENTS

2005/0072941 A1* 4/2005 Tanimoto ............... B82Y 40/00
250/492.23
2014/0225008 A1* 8/2014 Yoshikawa ......... H01J 37/3177
250/492.3
(Continued)

FOREIGN PATENT DOCUMENTS

JP 2005-116743 A 4/2005
JP 2013-128032 A 6/2013
JP 2015-119043 A 6/2015

OTHER PUBLICATIONS

International Search Report (PCT/ISA/210) issued in PCT Application No. PCT/JP2019/039369 dated Dec. 24, 2019 with English translation (three (3) pages).
(Continued)

*Primary Examiner* — David E Smith
(74) *Attorney, Agent, or Firm* — Crowell & Moring LLP

(57) ABSTRACT

Provided is a charged particle beam device for which deterioration in throughput in the event of abnormality of multiple beams can be prevented. The charged particle beam device includes: a stage 11 on which a sample is mounted; a charged particle optical system configured to irradiate the sample with multiple beams including multiple primary beams; a detector 15 configured to detect secondary beams generated by interactions between the primary beams and the sample and output detection signals; and a control unit 17 configured to control the stage and the charged particle optical system to generate image data based on the detection
(Continued)

signals from the detector obtained by scanning the sample with the multiple beams using a first scanning method. The control unit changes, when the abnormality of the multiple beams is detected based on the image data, the multiple beams to scan the sample using a second scanning method, and a scanning width of the multiple beams for scanning the sample is greater in the second scanning method than in the first scanning method.

15 Claims, 14 Drawing Sheets

(51) Int. Cl.
  *H01J 37/153* (2006.01)
  *H01J 37/20* (2006.01)
  *H01J 37/244* (2006.01)
  *H01J 37/28* (2006.01)

(52) U.S. Cl.
  CPC .......... *H01J 37/153* (2013.01); *H01J 37/244* (2013.01); *H01J 37/28* (2013.01); *H01J 2237/1536* (2013.01); *H01J 2237/2448* (2013.01); *H01J 2237/2806* (2013.01)

(56) References Cited

U.S. PATENT DOCUMENTS

2015/0170878 A1* 6/2015 Sugiyama ........... H01J 37/3177
  355/77
2020/0043701 A1* 2/2020 Matsumoto ......... H01J 37/3026

OTHER PUBLICATIONS

Japanese-language Written Opinion (PCT/ISA/237) issued in PCT Application No. PCT/JP2019/039369 dated Dec. 24, 2019 (three (3) pages).

* cited by examiner

[FIG. 1]
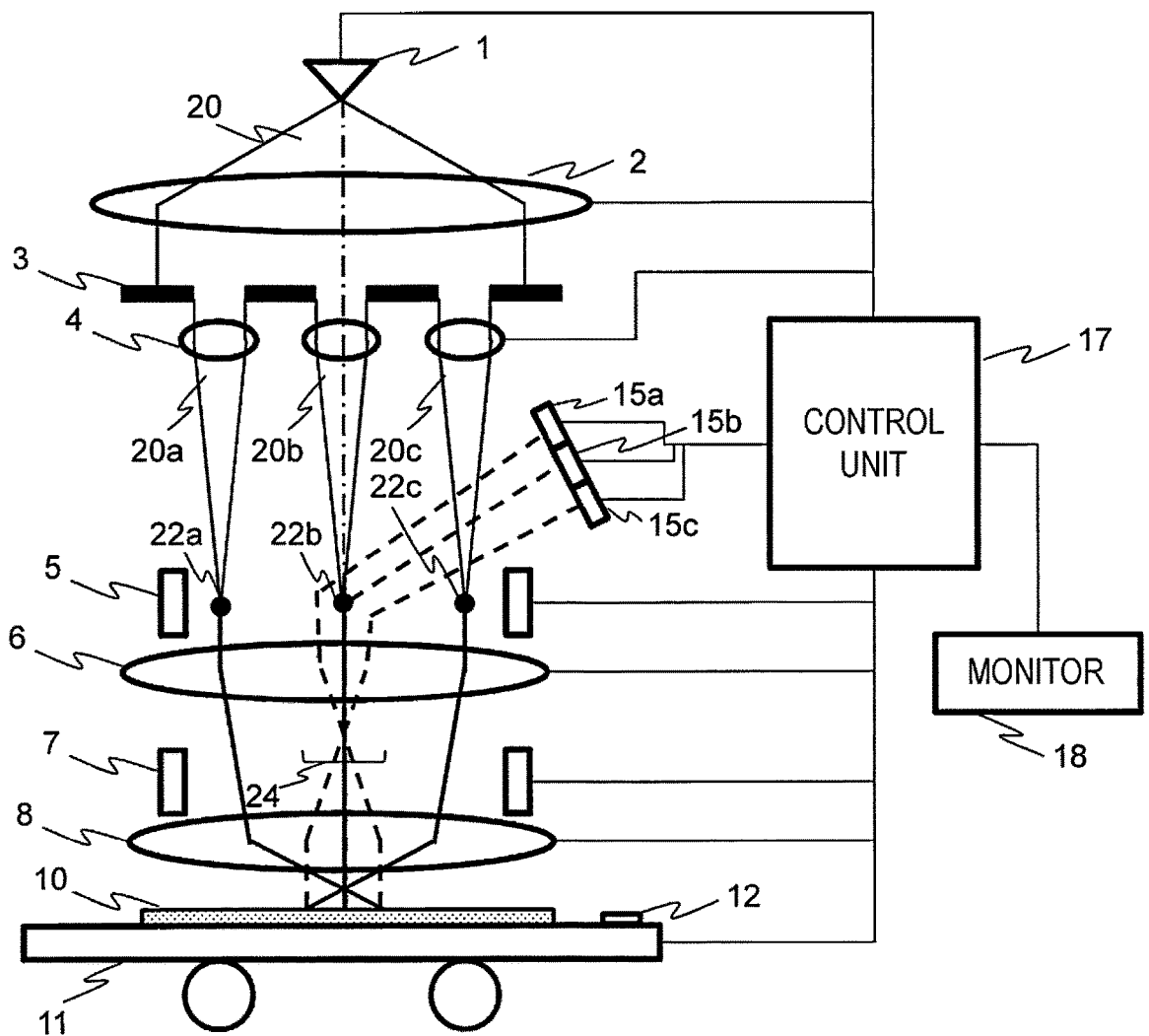
[FIG. 2]
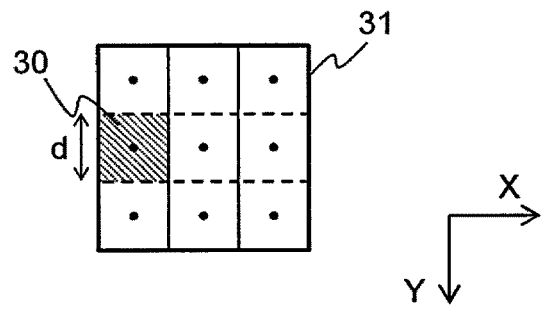

[FIG. 3]
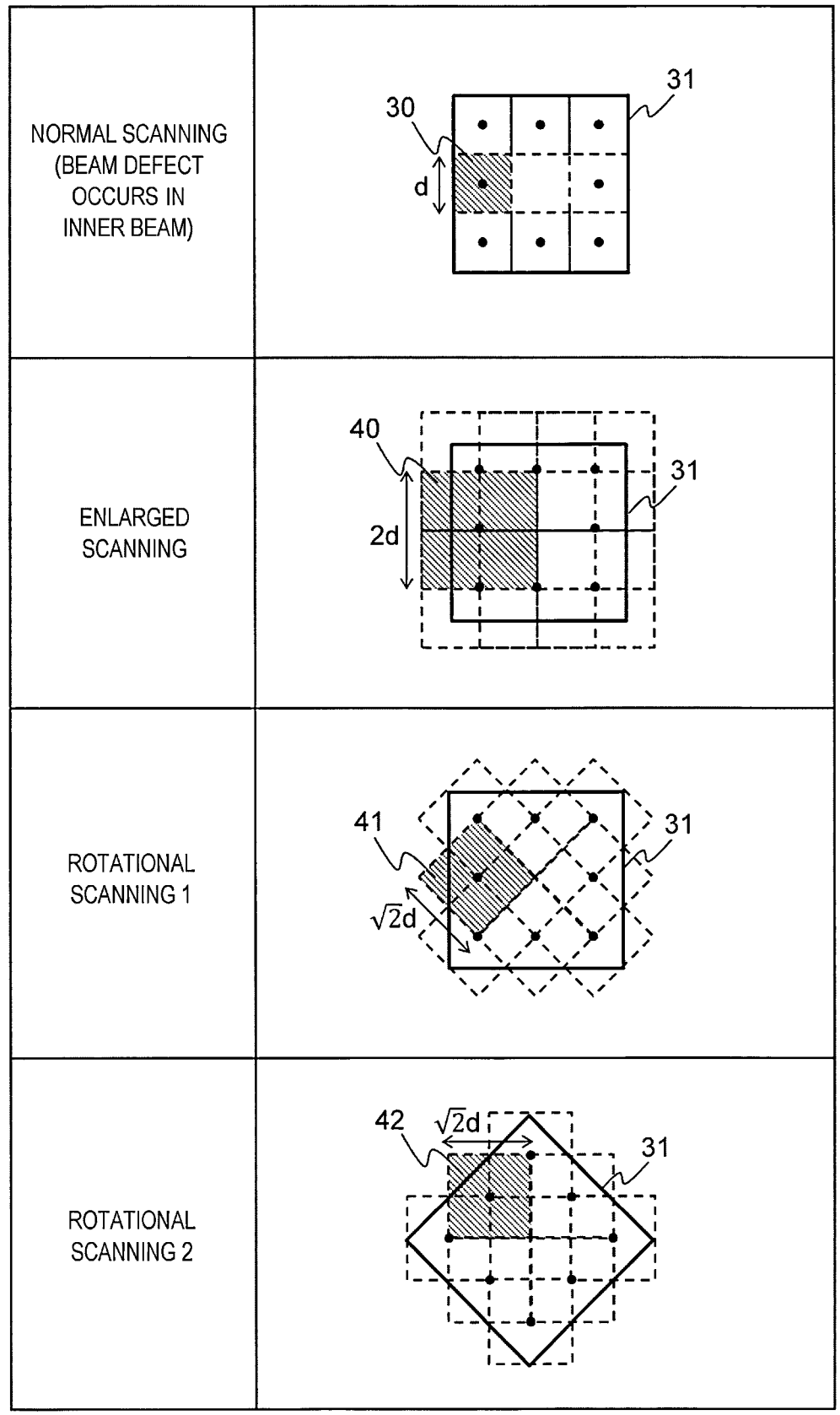

[FIG. 4]
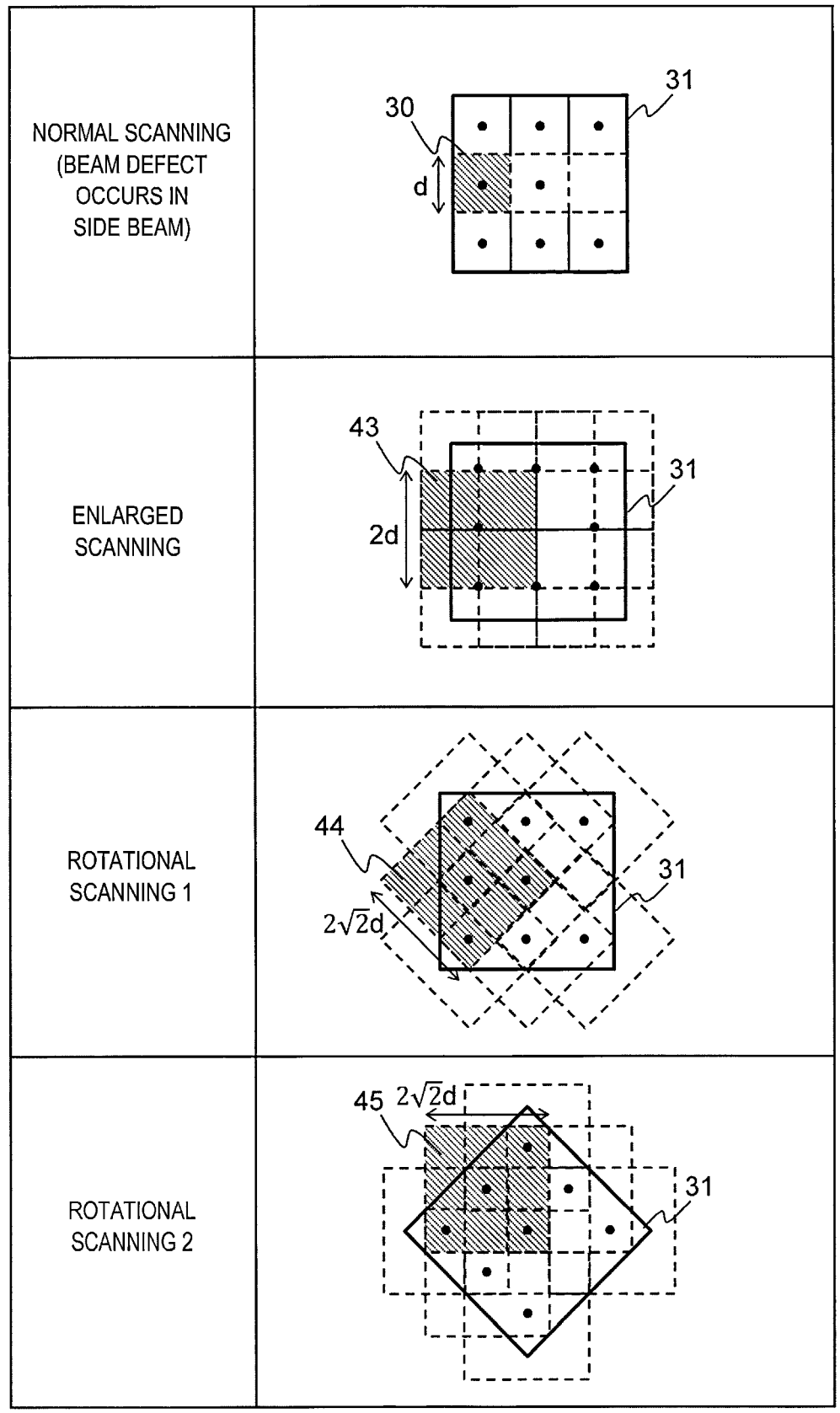

[FIG. 5]
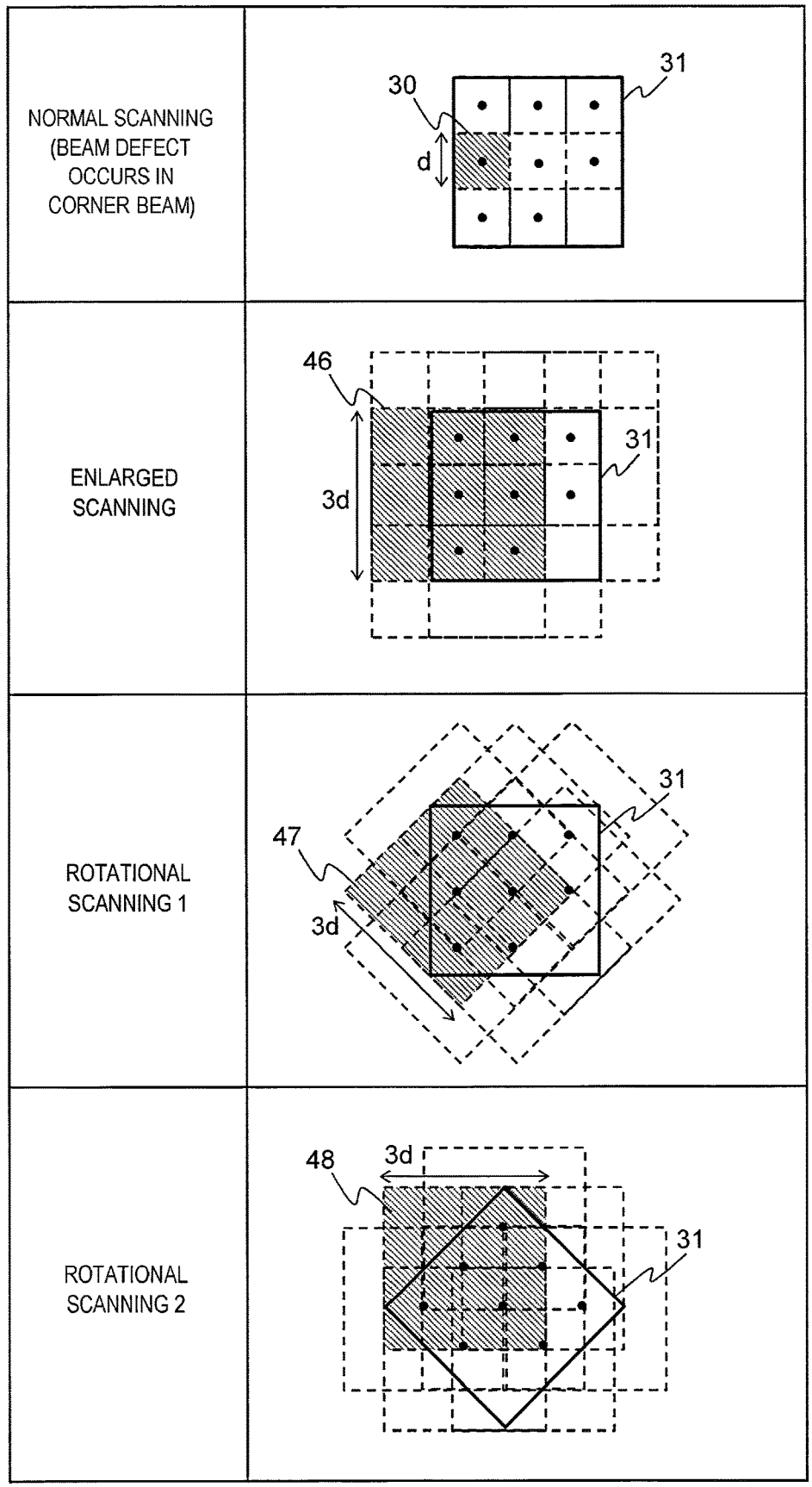

[FIG. 6]
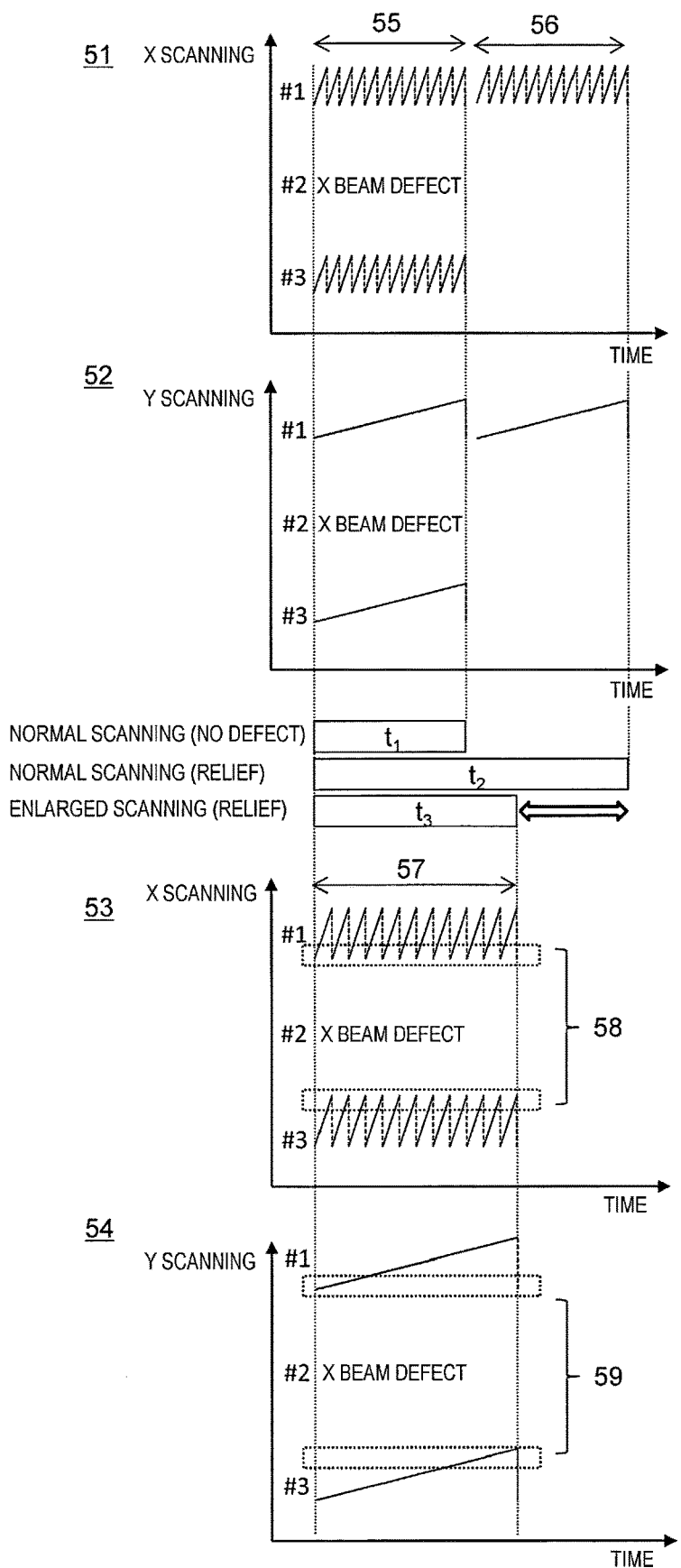

[FIG. 7]
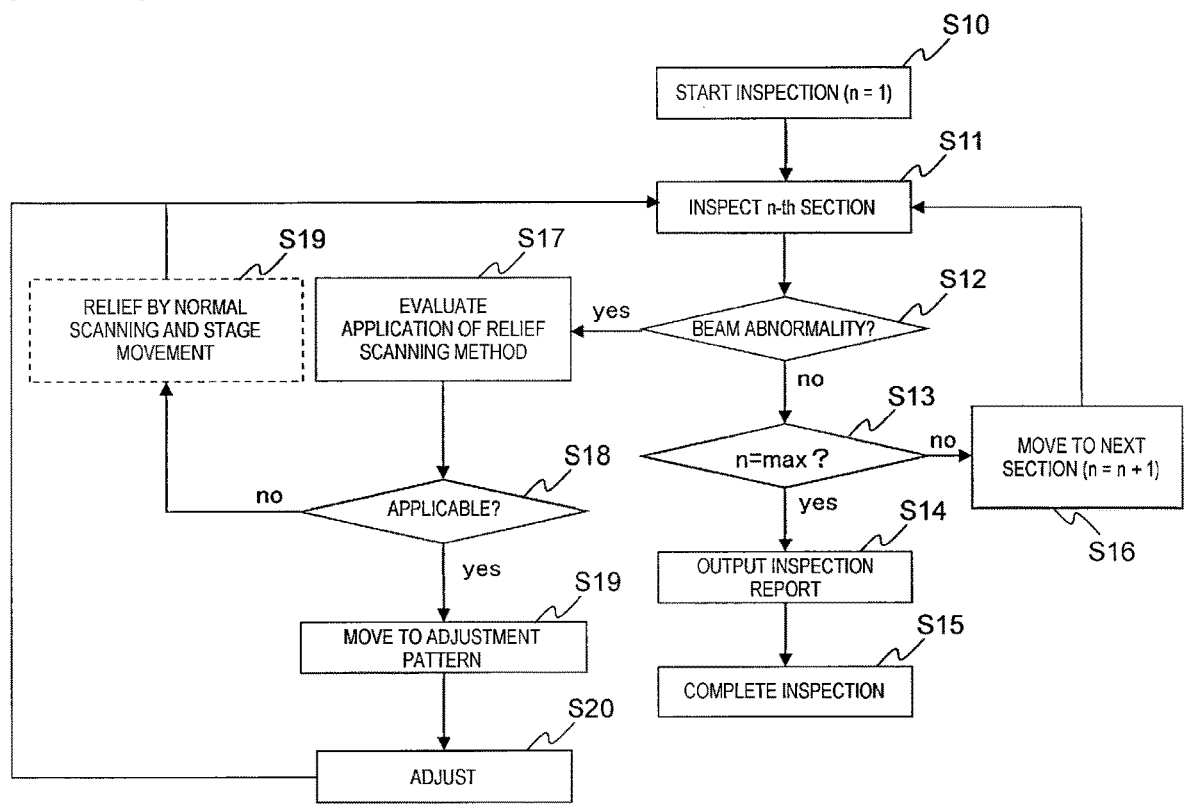

[FIG. 8]
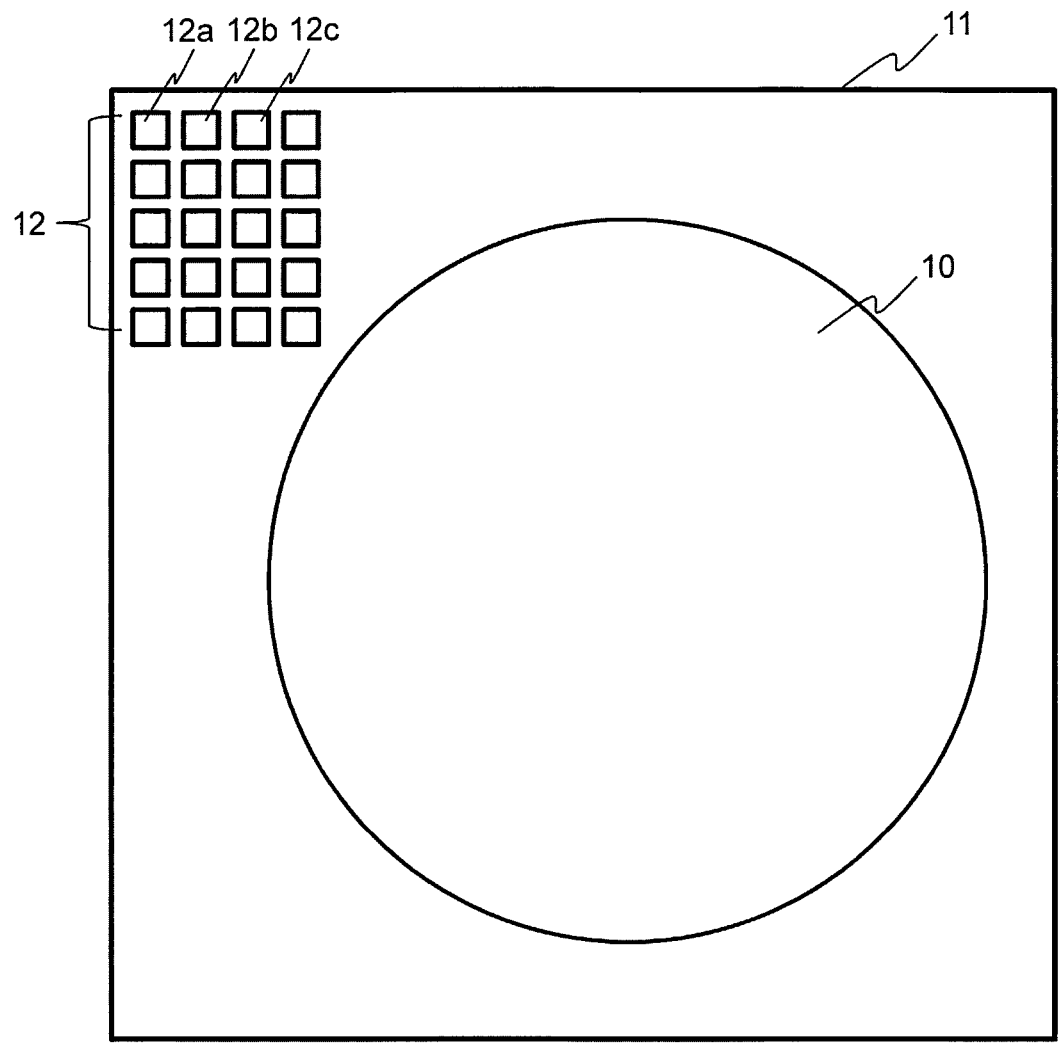

[FIG. 9]
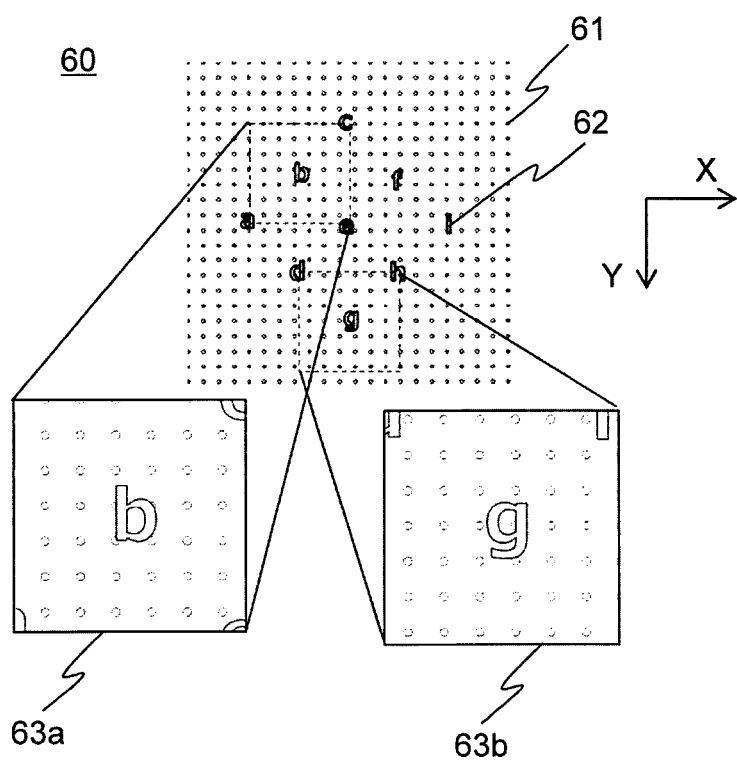

[FIG. 10]
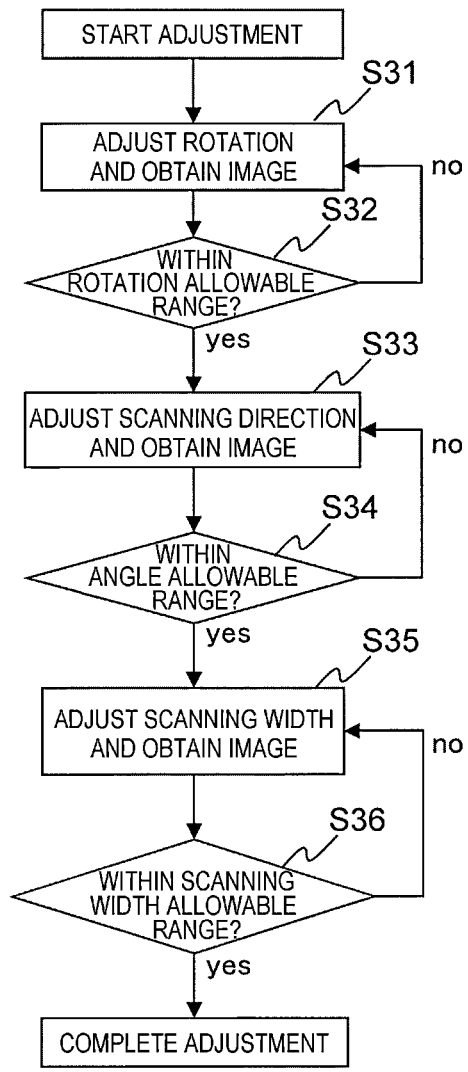

[FIG. 11]
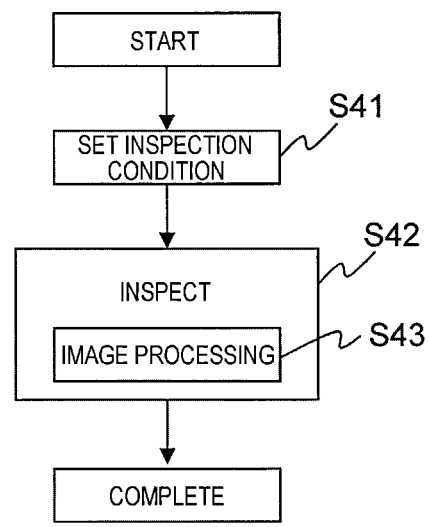

[FIG. 12]
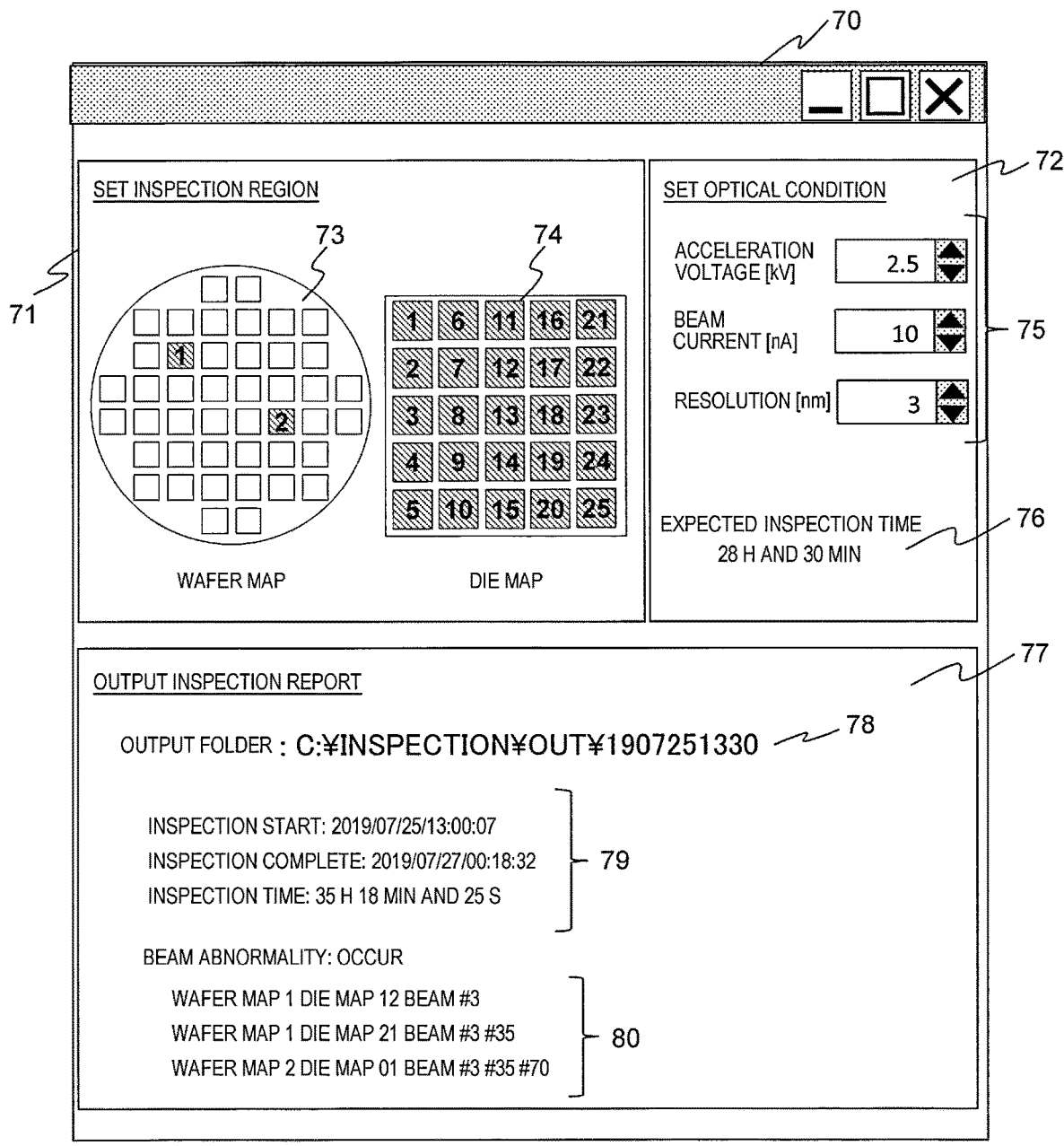

[FIG. 13A]
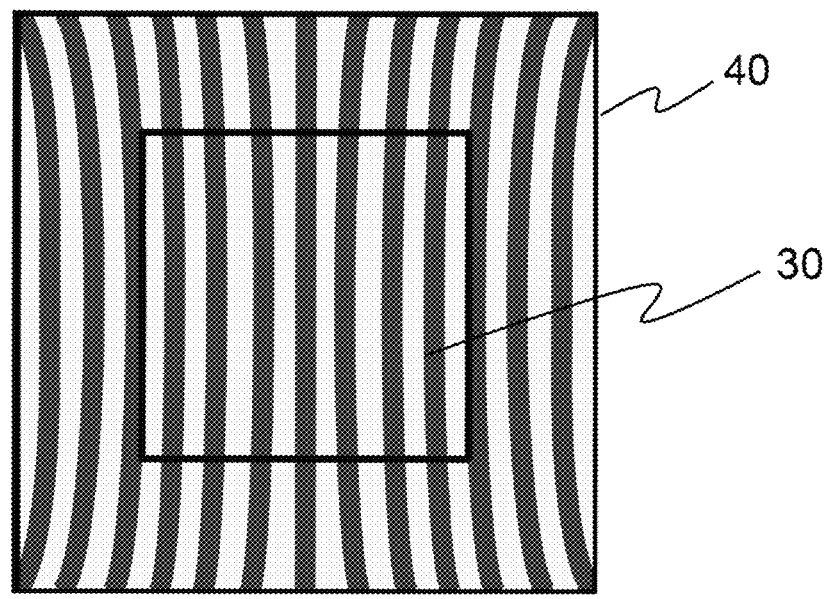
[FIG. 13B]
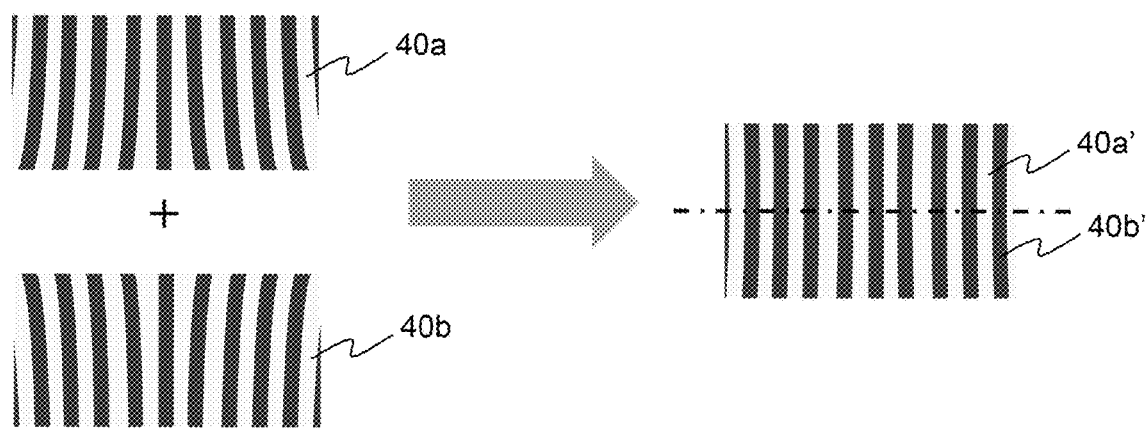

[FIG. 14]
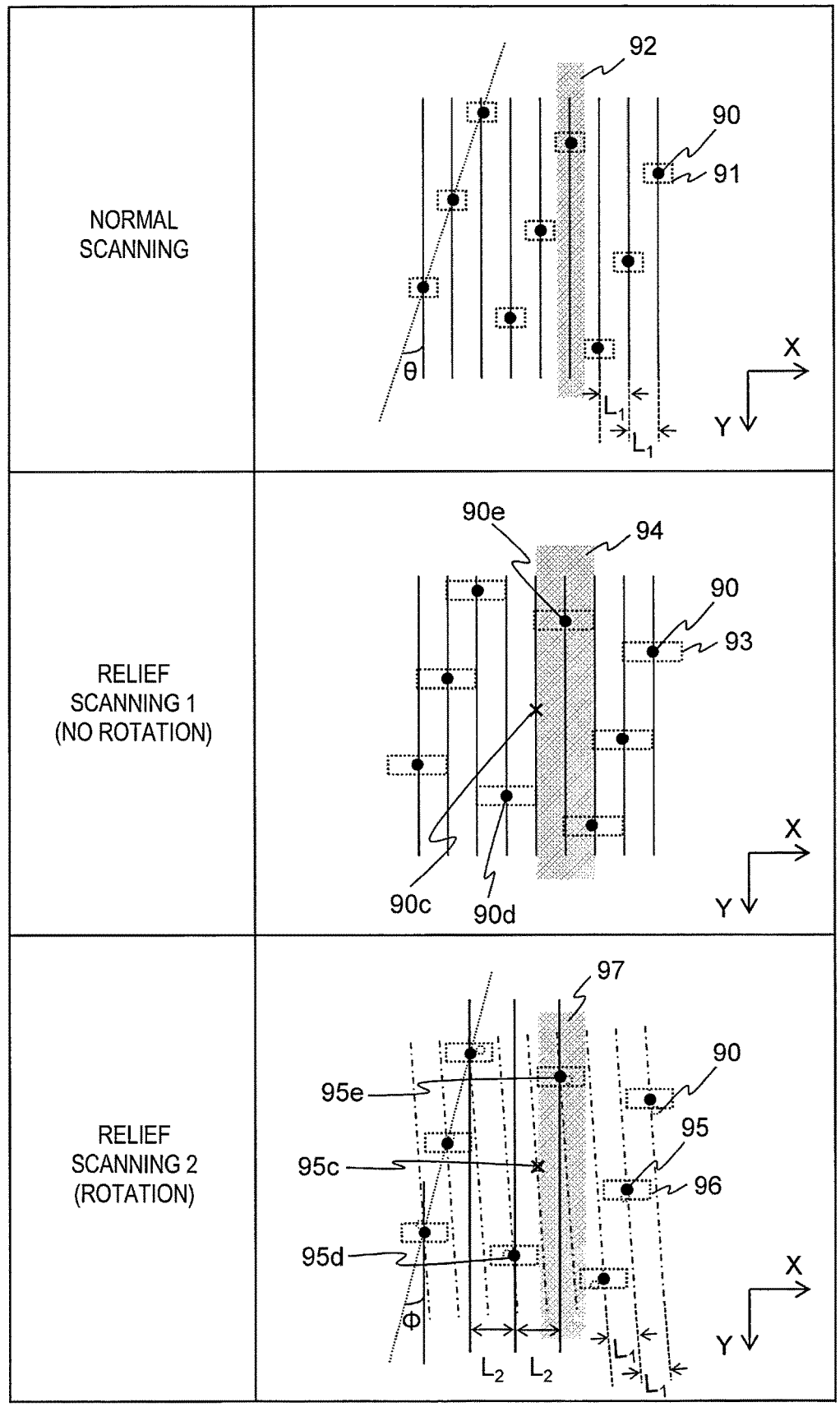

[FIG. 15]
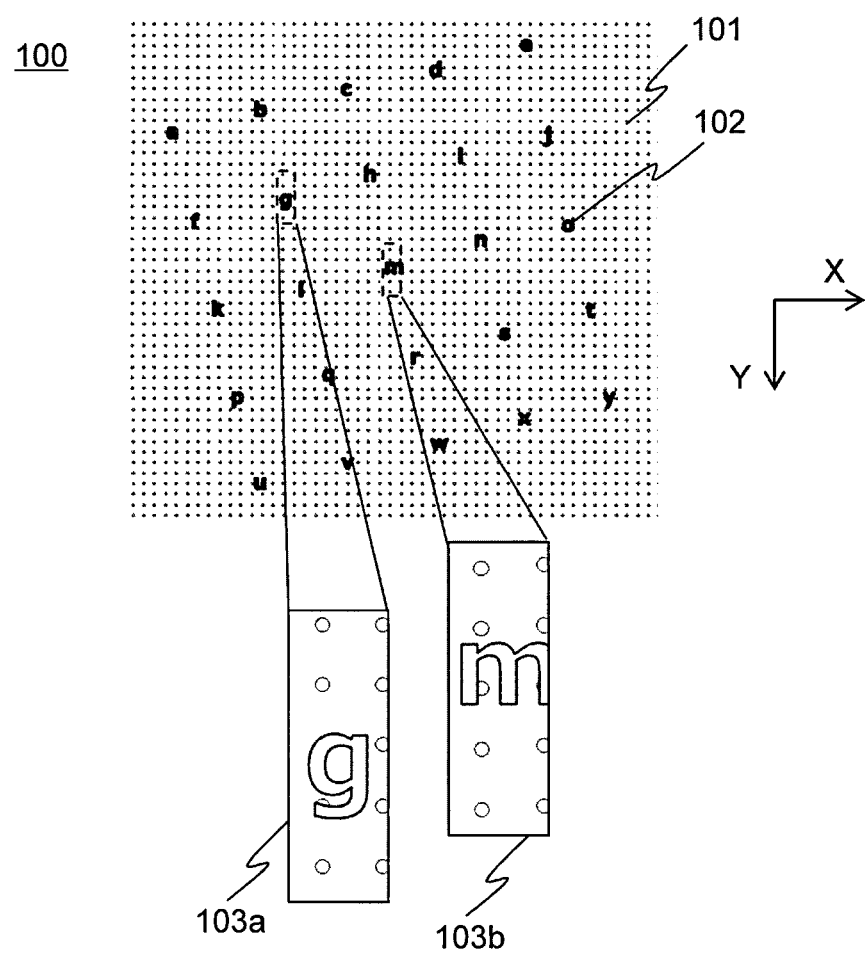

CHARGED PARTICLE BEAM DEVICE AND INSPECTION METHOD

TECHNICAL FIELD

The present invention relates to a multibeam-type charged particle beam device and an inspection method using the same.

BACKGROUND ART

In a process of manufacturing a semiconductor, a magnetic disk, or the like, a sample is irradiated with a charged particle beam (hereinafter, referred to as a primary beam) such as an electron beam or an ion beam, a signal of a secondary charged particle (hereinafter, referred to as a secondary beam) such as a generated secondary electron is acquired, and a length measurement device that measures a shape and a dimension of a pattern formed on the sample, an inspection device that checks presence or absence of a defect, and the like are used.

An important issue of such a charged particle beam device is to improve a speed (inspection speed) for processing a sample. Therefore, a multibeam-type charged particle beam device in which multiple primary beams irradiate a sample has been proposed.

CITATION LIST

Patent Literature

PTL 1: JP-A-2015-119043
PTL 2: JP-A-2013-128032

SUMMARY OF INVENTION

Technical Problem

In the case of a multibeam-type charged particle beam device, the primary beams pass through a fine aperture array to be multiple beams. Therefore, when even one aperture of the aperture array deteriorates and an abnormal beam is generated, the beam from the aperture cannot be used. In this case, it is considered to recover a scan region of the defective beam with another beam. However, in order to obtain image data of the same field of view, the region is scanned again with another sound beam, and throughput is reduced to ½ by a simple calculation.

PTL 1 relates to a multibeam-type writing device, and in a case where a defective beam is generated, change amounts of irradiation positions of multiple beams are changed, and a normal beam is irradiated to a planned irradiation position of the defective beam. In PTL 1, a transmission error of a control signal to each blanker constituting a blanking array is assumed as a cause for the defective beam, and it is necessary to recover with another beam only when the transmission error occurs. In contrast, each time a defect occurs in the aperture array per se, recovery is required, and the throughput is reduced to ½ as described above.

PTL 2 also relates to a multibeam-type writing device, and discloses that when a defective beam is generated, a partial region including a larger number of openings except for an opening in which the defective beam is generated is set, and writing processing is performed using multiple beams formed by passing through the partial region.

Solution to Problem

A charged particle beam device according to an aspect of the present invention includes: a stage on which a sample is mounted; a charged particle optical system configured to irradiate the sample with multiple beams including multiple primary beams; a detector configured to detect secondary beams generated by interactions between the primary beams and the sample and output detection signals; and a control unit configured to control the stage and the charged particle optical system to generate image data based on the detection signals from the detector obtained by scanning the sample with the multiple beams using a first scanning method. The control unit is configured to change, when abnormality of the multiple beams is determined based on the image data, the multiple beams to scan the sample using a second scanning method, and a scanning width of the multiple beams for scanning the sample is greater in the second scanning method than in the first scanning method.

Advantageous Effect

The charged particle beam device for which deterioration in throughput thereof in the event of the abnormality of the multiple beams can be prevented, or an inspection method using the same is provided.

Other problems and novel characteristics will become apparent from a description of the present specification and the accompanying drawings.

BRIEF DESCRIPTION OF DRAWINGS

FIG. 1 is a configuration diagram of a multibeam-type charged particle beam device.
FIG. 2 is a diagram of a field of view of the multibeam-type charged particle beam device.
FIG. 3 is a diagram illustrating a relief scanning method when a beam defect occurs in an inner beam.
FIG. 4 is a diagram illustrating the relief scanning method when the beam defect occurs in a side beam.
FIG. 5 is a diagram illustrating the relief scanning method when the beam defect occurs in a corner beam.
FIG. 6 is a diagram illustrating an effect of the relief scanning of the present embodiment.
FIG. 7 is a diagram showing a relief sequence.
FIG. 8 is a top view of a stage.
FIG. 9 is an example of an adjustment pattern.
FIG. 10 is a detailed flow for adjusting a field of view of the relief scanning.
FIG. 11 is an inspection condition setting flow.
FIG. 12 is an example of a GUI screen.
FIG. 13A is a diagram showing one of problems of image processing during the relief scanning.
FIG. 13B is a diagram illustrating the image processing during the relief scanning.
FIG. 14 is an example of normal scanning and relief scanning in a continuous scanning method.
FIG. 15 is an example of the adjustment pattern.

DESCRIPTION OF EMBODIMENTS

Hereinafter, preferred embodiments of the invention will be described with reference to the drawings.

FIG. 1 shows a configuration of a multibeam-type charged particle beam device. A primary beam 20 emitted from an electron source 1 is adjusted to be substantially parallel by a collimator lens 2 and is incident on an aperture array 3. The aperture array 3 is provided with a plurality of openings, and the primary beam 20 is divided by only the number of openings. FIG. 1 illustrates three beams of the divided beams. The divided primary beams 20a to 20c are individually focused by a lens array 4 to form a plurality of electron source images 22a, 22b, and 22c. The lens array 4 includes, for example, three electrodes each provided with a plurality of openings, and acts as, by applying a voltage to a central electrode of the electrodes, an einzel lens with respect to the primary beam 20 passing through the corresponding opening.

The primary beam 20 individually focused by the lens array 4 passes through a beam separator 5. The beam separator 5 is configured to separate the primary beam 20 from a secondary beam 24. As the beam separator 5, for example, a Wien filter that generates a magnetic field and an electric field orthogonal to each other in a plane substantially perpendicular to an incident direction of the primary beam and forms a deflection angle corresponding to energy of a passing electron can be used. In the present embodiment, intensities of the magnetic field and the electric field are set so that the primary beam 20 travels linearly, and further, the intensities of the magnetic field are adjusted and controlled so as to deflect the secondary beam 24 incident from an opposite direction at a desired angle. A position of the beam separator 5 is aligned with height of the electron source images 22a to 22c of the primary beams 20 to reduce influence of aberration on the primary beams 20. An objective lens 8 is an electromagnetic lens, and reduces and projects the electron source images 22a to 22c. In addition, an electron optical system of the charged particle beam device of the present embodiment is provided with a rotation lens 6. The rotation lens 6 rotatably projects the electron source images 22a to 22c around an optical axis.

The divided primary beams 20 receive a deflecting action in substantially the same direction and at only substantially the same angle by a deflector 7 for scanning and deflection respectively, and scan a sample 10 mounted on a stage 11. The divided primary beams 20 that reach a surface of the sample 10 interact with a substance in the vicinity of the surface of the sample. Accordingly, secondarily generated electrons such as reflected electrons, secondary electrons, and Auger electrons are generated from the sample, and the secondary beam 24 is formed. The secondary beam 24 receives a focusing action of the objective lens 8, and then is separated from a trajectory of the primary beam 20 by the beam separator 5 having the deflecting action with respect to the secondary beam 24, and reaches a detector 15 provided corresponding to the divided primary beam (the figure shows detectors 15a to 15c corresponding to the divided primary beams 20a to 20c). In addition, in addition to the sample 10 being mounted on the stage 11, a standard sample 12 is mounted on the stage 11. An adjustment pattern is formed on a surface of the standard sample 12.

A charged particle optical system including the electron source 1, the collimator lens 2, the lens array 4, the beam separator 5, the rotation lens 6, the deflector 7, the objective lens 8, and other optical elements (not shown), and the stage 11 are uniformly controlled by a control unit 17. An operator can set an optical condition of the charged particle optical system or the like and an inspection condition for inspecting a sample through a graphical user interface (GUI) displayed on a monitor 18. In addition, image data is generated by processing such as amplification and digitization from a signal, which is detected by the detector 15, and the generated image data is temporarily stored in a storage device in the control unit 17. Then, the control unit 17 calculates various statistics based on the image data, and finally determines presence or absence of a defect in the sample 10. A determination result is displayed on the monitor 18.

FIG. 2 shows a field of view of a multibeam-type charged particle beam device shown in FIG. 1. The primary beam is divided into nine beams by the aperture array, and the divided primary beams (referred to as multiple beams) are in a state having no beam defect. A unit field of view 30 is a region on an XY plane orthogonal to the optical axis, where the region is scanned with one beam of the multiple beams by the deflector 7. In this example, the unit field of view 30 is a rectangular region in which the length of one side is d in both an X direction and a Y direction. When there is no beam defect, a field of view 31 obtained by integrating nine unit fields of view 30 is obtained as a field of view of the charged particle beam device. Meanwhile, if there is a beam defect, a detection signal of a unit field of view of a beam in which the beam defect occurs in the field of view 31 is insufficient or cannot be obtained. In the present embodiment, when the beam defect occurs in the multiple beams, the beam defect can be relieved by changing the scanning method.

A relief scanning method for relieving the beam defect when a defect occurs in a beam (referred to as an inner beam) of the multiple beams located on an inner side will be described with reference to FIG. 3. Similar to FIG. 2, a field of view (unit field of view) of one beam constituting the multiple beams is shown as a hatched region, and a point located at the center of the unit field of view (hatched region) is a beam scanning the unit field of view. In addition, stages are referred to as a first stage to a fourth stage from the top of FIG. 3 in order. The same applies to subsequent FIGS. 4 and 5.

The first stage of FIG. 3 is in a state in which the beam defect occurs in the inner beam, and a correct detection signal regarding a central portion of the field of view 31 cannot be acquired in normal scanning. Therefore, scanning for changing the fields of view of the multiple beams as shown in the second to fourth stages is performed to relieve the beam defect.

The second stage is an enlarged scanning, and a scanning width of the enlarged scanning is increased with respect to a scanning width of the normal scanning with scanning directions of the multiple beams being maintained. In this example, the scanning width is twice that of the normal scanning (that is, one side of each unit field of view 40 is 2d). Missing of a unit field of view of the inner beam, in which the beam defect occurs in the normal scanning, is relieved by enlarging unit fields of view of peripheral beams, and a region corresponding to the field of view 31 of the normal scanning is cut out from a field of view obtained by integrating eight unit fields of view 40 of peripheral beams.

The third stage is first rotational scanning, changes the scanning directions of the multiple beams, and increases the scanning width of the first rotational scanning with respect to the scanning width in the case of the normal scanning. In this example, the scanning direction is rotated by 45°, and the scanning width is set to √2 times that of the normal scanning (that is, one side of each unit field of view 41 is √2d). Missing of the unit field of view of the inner beam, in which the beam defect occurs in the normal scanning, is relieved by rotating and enlarging the unit fields of view of the peripheral beams, and a region corresponding to the field of view 31 of the normal scanning is cut out from a field of view obtained by integrating the unit fields of view 41 of the eight peripheral beams. The scanning directions of the beams can be rotated by the deflector 7 shown in FIG. 1.

The fourth stage is second rotational scanning. When the unit field of view is enlarged, distortion occurs in an image in a region exceeding the original unit field of view 30 in the normal scanning. Therefore, the enlargement of the scanning width is preferably as small as possible. Meanwhile, in the first rotational scanning, the scanning direction is different from that of the normal scanning, which may cause a difference from an image obtained by the normal scanning. Therefore, in the second rotational scanning, the array of the multiple beams is rotated, and the scanning width of the second rotational scanning is increased with respect to the scanning width in the normal scanning with the scanning direction being maintained. In this example, the array of the multiple beams is rotated by 45°, and the scanning width is set to √2 times that of the normal scanning (that is, one side of each unit field of view 42 is √2d). Missing of the unit field of view of the inner beam, in which the beam defect occurs in the normal scanning, is relieved by rotating the array of the multiple beams and enlarging the unit fields of view of the peripheral beams, and a region corresponding to the field of view 31 of the normal scanning is cut out from a field of view obtained by integrating the unit fields of view 42 of the eight peripheral beams. The field of view 31 to be cut out is rotated in accordance with the rotation of the array of the multiple beams. Accordingly, in the second rotational scanning, the increase of the scanning width can be prevented without making the scanning direction different from that of the normal scanning. The array of the multiple beams can be rotated by the rotation lens 6 shown in FIG. 1.

A relief scanning method for relieving the beam defect when a defect occurs in a beam (referred to as a side beam) of the multiple beams located on a peripheral portion (here, the peripheral portion does not include a corner portion) will be described with reference to FIG. 4.

A first stage of FIG. 4 is in a state in which the beam defect occurs in one of side beams, and a correct detection signal regarding the peripheral portion of the field of view 31 corresponding to the side beam in which the beam defect occurs cannot be obtained in the normal scanning. Therefore, scanning for changing the fields of view of the multiple beams as shown in second to fourth stages is performed to relieve the beam defect. The same applies to a case where the beam defect occurs in other side beams.

The second stage is enlarged scanning, and is the same as the enlarged scanning when the beam defect occurs in the inner beam.

The third stage is the first rotational scanning, and in this example, the scanning direction is rotated by 45°, and the scanning width is set to 2√2 times that of the normal scanning (that is, one side of each unit field of view 44 is 2√2d). The fourth stage is the second rotational scanning, and in this example, the array of the multiple beams is rotated by 45°, and the scanning width is set to 2√2 times that of the normal scanning (that is, one side of each unit field of view 45 is 2√2d). Accordingly, in the rotational scanning, the amount of increase of the scanning width varies depending on a position of the beam in which the beam defect occurs.

A relief scanning method for relieving the beam defect when a defect occurs in a beam (referred to as a corner beam) of the multiple beams located on a corner portion will be described with reference to FIG. 5.

A first stage of FIG. 5 is in a state in which the beam defect occurs in one of corner beams, and a correct detection signal regarding a corner portion of the field of view 31 corresponding to the corner beam in which the beam defect occurs cannot be obtained in the normal scanning. Therefore, scanning for changing the fields of view of the multiple beams as shown in second to fourth stages is performed to relieve the beam defect. The same applies to a case where the beam defect occurs in other corner beams.

The second stage is an enlarged scanning, and in this example, the scanning width is set to three times that of the normal scanning (that is, one side of each unit field of view 40 is 3d).

The third stage is the first rotational scanning, and in this example, the scanning direction is rotated by 45°, and the scanning width is set to 3 times that of the normal scanning (that is, one side of each unit field of view 47 is 3d). The fourth stage is the second rotational scanning, and in this example, the array of the multiple beams is rotated by 45°, and the scanning width is set to 3 times that of the normal scanning (that is, one side of each unit field of view 48 is 3d).

Accordingly, when the beam defect occurs in a corner portion of the multiple beams, the amount of increase of the scanning width is the greatest in both the enlarged scanning and the rotational scanning.

FIGS. 3 to 5 show examples in which a beam defect occurs in one beam of the multiple beams. Even when a plurality of beam defects occur, the image data of the original field of view 31 can be obtained by any one of the relief scanning methods shown in FIGS. 3 to 5.

Effects of the relief scanning of the present embodiment will be described with reference to FIG. 6. Time charts 51 and 52 show time charts for relieving the beam defect by the normal scanning, and time charts 53 and 54 show time charts (schematic diagrams) for relieving the beam defect by the enlarged scanning which is an aspect of the relief scanning. FIG. 6 shows an example in which the multiple beams scan the field of view using a step and repeat method. In addition, the multiple beams include first to third beams, and it is assumed that the beam defect occurs in the second beam.

When the beam defect is relieved by the normal scanning, the normal scanning is performed in a period of time 55, and then a unit field of view of the second beam is scanned by the first beam in a period of time 56. Therefore, when a time required for scanning the field of view by the normal scanning is assumed to be $t_1$, a time $t_2$ required for scanning the field of view including the relief when the beam defect occurs is approximate twice the time $t_1$.

In contrast, when the beam defect is relieved by the relief scanning, the relief scanning (here, enlarged scanning) is performed in a period of time 57 to relieve the beam defect of the second beam, and therefore, the scanning width is increased in both an X direction and a Y direction as compared with the normal scanning. In the time charts 53 and 54, the increased scanning widths are surrounded by broken line frames 58 and 59. By enlarging the scanning width, a time $t_3$ required for scanning the field of view becomes longer than the time $t_1$ required for scanning the field of view by the normal scanning. However, the time $t_3$ can be made shorter than the time $t_2$, and a time for acquiring the image data when the beam defect occurs in the multiple beams can be shortened.

FIG. 7 shows an inspection sequence for inspecting a sample by the multibeam-type charged particle beam device. For example, a semiconductor wafer is assumed as the sample. Whether a beam defect occurs in the multiple beams during the inspection is periodically diagnosed, and when a beam defect occurs, the sample is inspected by changing the scanning method from the normal scanning to the relief scanning method. Therefore, a section serving as a unit inspection region is set for the sample, and determination of abnormality of the multiple beams is performed each time the inspection of one section is completed. The inspection sequence is executed by the control unit 17 in FIG. 1.

When the inspection of the sample is started from a first section (S10) and the inspection of one section is completed (S11), whether the abnormality occurs in the multiple beams is determined (S12). Any method for setting the section may be employed. For example, when the semiconductor wafer having a wide region to be inspected with respect to the field of view is inspected by moving the field of view from a start point to an endpoint in the Y direction, shifting the region to be inspected by one field of view in the X direction, and moving the field of view again from the start point to the endpoint in the Y direction, a region of one row of the field of view extending in the Y direction may be set as one section. Accordingly, a timing of a significant movement operation of the stage 11 required when the abnormality of the multiple beams occurs can be made the same as the timing of a significant movement operation of the stage 11 required for the movement of the field of view.

When there is no abnormality in the multiple beams (no in S12) and the section is not the last section (no in S13), the field of view is moved to a next section (S16), and the inspection is continued. When inspection of the last section is completed (yes in S13), an inspection report is output (S14), and the inspection is completed (S15).

The determination of the abnormality of the multiple beams in step S12 is performed based on the image quality of the image data (SEM image) of the unit field of view that is generated by the control unit 17. A determination method is not particularly limited. For example, if the SEM image of each unit field of view includes a common specific pattern, the SEM image of the specific pattern may be digitized to determine the presence or absence of the abnormality. When the SEM image does not have the common specific pattern, average values of S/N and a detection signal amount may be calculated for each SEM image of the unit field of view, and the presence or absence of the abnormality may be determined based on the magnitude of variation of the S/N and the detection signal amount in the SEM image of the unit field of view. The value to be calculated indicating the image quality is not limited to the above example, and may be a value indicating sharpness of an image, such as a DR value or a CG value.

When the abnormality occurs in the multiple beams (yes in S12), whether the relief scanning method is applicable is evaluated (S17). As described above, the scanning width of one beam is greater than that in the normal scanning in the relief scanning, distortion occurs in the unit field of view of the relief scanning exceeding the unit field of view of the normal scanning, and therefore, the resolution is degraded. Therefore, the relief scanning may not be applicable depending on the resolution required for the inspection. Therefore, whether the relief scanning is applicable is evaluated, and if the relief scanning is applicable (yes in S18), an inspection image is obtained by the relief scanning. Meanwhile, if the relief scanning is not applicable (no in S18), for example, the relief of the beam defect due to the normal scanning shown in FIG. 6 is performed (S19). When it is determined that the abnormality occurs in the multiple beams in diagnosis after a k-th section inspection, the inspection is performed again from the k-th section inspection.

When any one of the relief scanning methods is applicable, the multiple beams are moved to the adjustment pattern of the standard sample 12 (S19), and the scanning width, the scanning direction, or the array of the multiple beams is adjusted so as to be in a desired state of the relief scanning shown in FIGS. 3 to 5 using the adjustment pattern.

FIG. 8 shows a top view of the stage 11. In the example, an upper surface of the stage 11 is mounted with a plurality of standard samples 12. Adjustment patterns corresponding to the respective relief scanning methods are formed on surfaces of the plurality of standard samples 12. For example, an adjustment pattern for the enlarged scanning in the case where there is a beam defect in the inner beam shown in the second stage of FIG. 3 is formed on a standard sample 12a, an adjustment pattern for the first rotational scanning in the case where there is a beam defect in the inner beam shown in the third stage of FIG. 3 is formed on a standard sample 12b, and an adjustment pattern for the second rotational scanning in the case where there is a beam defect in the inner beam shown in the fourth stage of FIG. 3 is formed on a standard sample 12c. In the example, a standard sample is provided for each adjustment pattern, but a plurality of adjustment patterns may be formed on one standard sample.

FIG. 9 shows an example of the adjustment pattern for the second rotational scanning (see the fourth stage of FIG. 3) in the case where there is a beam defect in the inner beam. The adjustment pattern 60 includes dot patterns 61 regularly arranged at a predetermined pitch in a matrix, and specific patterns 62 arranged according to a desired array of the multiple beams. Here, the specific patterns 62 are indicated by alphabets, and alphabets a to i are arranged so as to be the centers of the unit fields of view 42 in the case of the second rotational scanning.

The SEM image of the adjustment pattern 60 is obtained by controlling the rotation lens 6 and the deflector 7 in accordance with the setting of the second rotational scanning when a beam defect occurs in the inner beam. For the SEM image 63 of each unit field of view, (1) a position of a specific pattern,
(2) an inclination of dot array, and
(3) the number of the dots provided in the X direction and the Y direction are confirmed. (1) if the position of the specific pattern is at the center of the SEM image 63 of the unit field of view, it can be determined that the array of the multiple beams is appropriately rotated, (2) if the dots are arranged to be perpendicular and parallel to the SEM image 63 of the unit field of view, it can be determined that the scanning direction is appropriate, and (3) if a specified number of dots appear in both the X direction and the Y direction in the SEM image 63 of the unit field of view, it can be determined that the scanning width is appropriate.

FIG. 10 shows details of step S20 for adjusting a field of view of the relief scanning. Step S31 is to adjust the rotation of the array of the multiple beams, and corresponds to the adjustment of (1) described above. Step S33 is to adjust the scanning direction, and corresponds to the adjustment of (2) described above. Step S35 is to adjust the scanning width, and corresponds to the adjustment of (3) described above. An adjustment order of these three types of parameters is not limited to FIG. 10, and the adjustment order may be changed. In addition, the adjustment pattern is not limited to that shown in FIG. 9, and may be a pattern whose three parameters including the array of the multiple beams, the scanning direction, and the scanning width can be adjusted.

FIG. 11 shows an inspection condition setting flow for executing the inspection sequence of FIG. 7. In the inspection condition setting flow of the present embodiment, in addition to a general inspection condition, an inspection condition including a condition setting for determining (step S18 in the inspection sequence) whether the relief scanning method is applicable is set (S41). FIG. 12 shows an example of a GUI screen for setting the inspection conditions. A GUI screen 70 is displayed on the monitor 18 (see FIG. 1).

In the example in FIG. 12, in order to set the inspection conditions, an inspection region setting screen 71 and an optical condition setting screen 72 are provided. In setting the inspection region, a die is selected by clicking a region to be inspected in a wafer on a wafer map 73, and a section to be inspected in the die on a die map is clicked and selected. In addition, as optical conditions 75 to be set, an acceleration voltage (energy of irradiating electrons), a probe current of a beam, and a resolution are exemplified here. Here, whether the relief scanning is applicable is determined depending on whether the set resolution is satisfied (referred to as a resolution condition). Specifically, the control unit 17 of the device stores, for each relief scanning, determination conditions that the relief scanning of the corner beam is applicable when the resolution is 3 nm or more, the relief scanning of the side beam is applicable when the resolution is 2 nm or more, and the relief scanning of the inner beam is applicable when the resolution is 1 nm or more, for example, and determines, according to the set resolution condition, whether the relief scanning is applicable when a beam defect occurs.

Since a time required for the inspection can be predicted when the optical condition and the inspection region described above are set, a calculated expected inspection time 76 is displayed. When the condition setting is completed, the inspection sequence (see FIG. 7) is executed according to the set conditions (S42).

Image processing (S43) performed in the inspection sequence (S41) will be described. In addition to normal image processing, unique image processing is required when the relief scanning is executed. The first is correction of distortion. As described above, in the unit field of view in the relief scanning, the distortion occurs in a region obtained by enlarging the unit field of view in the normal scanning. FIG. 13A schematically shows this state. Therefore, as shown in FIG. 13B, a unit field of view 40a and a unit field of view 40b adjacent to each other are not affected by the influence of the distortion as they are. Therefore, a unit field of view 40a' and a unit field of view 40b', which are calculated to remove the distortion so that the adjacent unit fields of view are smoothly connected, are connected to integrate the unit fields of view. A calculation method for removing distortion is not particularly limited, and for example, a method of extracting a pattern of a region to which a unit field of view of the unit fields of view is connected and calculating and correcting a distortion coefficient of SEM images of the adjacent unit fields of view so that the inclination of the region to be connected becomes 0, or a method of overlapping the fields of view, acquiring the SEM images of patterns on the same sample in different unit fields of view, and calculating and correcting each distortion coefficient so that the obtained patterns coincide with each other is considered.

The second is a correction of the overlap region of the unit fields of view. In the relief scanning, by enlarging the unit fields of view, the unit fields of view have an overlap region. Therefore, when the SEM images of the unit fields of view are simply synthesized, there is a difference (contrast) that a detection signal amount becomes relatively great in the region where the unit fields of view overlap with each other, but a detection signal amount is relatively small in a unit field of view other than the overlap region and a unit field of view in which a beam defect occurs. In order to correct the contrast associated with such a scanning method, for example, a detection signal is not added (thinned out) or brightness correction processing is performed for the overlap region to correct the contrast associated with the scanning method.

When inspection of all sections is completed, an inspection report is outputted (S14 in FIG. 7). An example of the inspection report displayed on the monitor 18 is shown in FIG. 12. In the example in FIG. 12, an inspection report output screen 77 is displayed below inspection condition setting screens 71 and 72. In the inspection report output screen 77, an address 78 of an output folder, an actual inspection time 79, and beam abnormality presence and absence information 80 during the inspection are displayed. The output folder stored in the address 78 stores output data such as the obtained SEM image, a defect map, and the abnormal beam information, and data (inspection recipe data) of the inspection region and the optical condition set as the inspection conditions.

Deviation from the expected inspection time 76, which is predicted at the time of setting the inspection conditions, can be confirmed by displaying the actual inspection time 79. An inspector can understand a cause of the deviation during the inspection time by displaying the beam abnormality presence and absence information 80 during the inspection. As the inspection report, it is desirable to display the defect map or the like that displays an inspection result in addition to the above.

The example in which the multiple beams scan the field of view using a step and repeat method is described, but the same relief scanning can be performed even when the field of view is scanned by a continuous scanning method. In the continuous scanning method, the stage 11 is continuously moved, the deflection caused by scanning and the movement of the stage are combined to control the primary beam to sequentially scan a band-shaped region. An entire predetermined inspection region is scanned by scanning a plurality of band-shaped regions with the multiple beams. FIG. 14 shows an example of the normal scanning in the case of the continuous scanning method and the relief scanning when a beam defect occurs.

The normal scanning in a case where there is no abnormality of the multiple beams will be described with reference to an upper diagram of FIG. 14. The stage continuously moves in the Y direction, and the primary beam is deflected in the X direction. Specifically, each black circle in the figure indicates a position of a primary beam 90, and the primary beam 90 is deflected in a range of a broken line frame 91 by an action of the deflector 7. As a result, the primary beams constituting the multiple beams scan a band-shaped region 92. In order for a plurality of band-shaped regions 92 to sufficiently cover the entire inspection region, distances L between adjacent beams obtained by projecting the array of the multiple beams in the scanning direction may be equal to each other. Therefore, the array of the multiple beams is rotated by θ with respect to the Y direction. Accordingly, in the normal scanning, each of the primary beams 90 constituting the multiple beams scans the band-shaped region 92 having a width $L_1$ respectively.

A middle stage of FIG. 14 shows first relief scanning. The first relief scanning is to increase the scanning width without changing the array of the multiple beams. In the example of FIG. 14, it is assumed that a beam defect occurs in a primary beam 90c located at the center, of nine primary beams constituting the multiple beams. In the first relief scanning, a rotation amount of the array of the multiple beams is set to (θ) which is the same as that in the normal scanning, and a scanning width is changed by the deflector 7. A deflection amount of each primary beam is indicated by a width of a broken line frame 93, and in this case, if the scanning width is twice as great as that of the normal scanning, a band-shaped region to be scanned by the primary beam 90c in which a beam defect occurs can be scanned by primary beams 90d and 90e adjacent to each other in the X direction. The scanning width at this time is twice as great as the scanning width ($L_1$) in the case of the normal scanning.

A lower stage of FIG. 14 shows second relief scanning. The second relief scanning is to rotate the array of the multiple beams and increase the scanning width in accordance with the rotation of the array of the multiple beams. The array of the multiple beams is rotated with respect to positions of the primary beams 90, indicated by white circles, in a case of the normal scanning. In the example, the array of the multiple beams is rotated with only a rotation amount Φ with respect to the Y direction, and primary beams 95 indicated by black circles in the figure are deflected in ranges of broken line frames 96 by receiving an action of the deflector 7. In the state, a scanning width is determined so that there is no inspection region where the band-shaped region to be scanned by the primary beam 95c in which a beam defect occurs is not scanned by band-shaped regions to be scanned by primary beams 95d and 95e adjacent to each other in the X direction. In this case, the primary beams 95 constituting the multiple beams scan a band-shaped region 97 having a width $L_2$ respectively. For reference, a scanning direction in the case of the normal scanning is indicated by one-dot chain lines, and the scanning width $L_1$ in the case of the normal scanning is indicated. At this time, $L_1 < L_2 < 2L_1$, the scanning width in the second relief scanning is greater than that in the normal scanning by rotating the array of the multiple beams, but there is an advantage that the scanning width can be prevented from being increased as compared with that of the first relief scanning in which the beam array is not changed.

FIG. 15 is an example of the adjustment pattern in the case of the continuous scanning method. In the case of the continuous scanning method, an adjustment pattern corresponding to the relief scanning method is prepared in the same manner as in the step and repeat method. An adjustment pattern 100 has the same configuration as that of the adjustment pattern in FIG. 9. That is, the adjustment pattern 100 includes dot patterns 101 regularly arranged at a predetermined pitch in a matrix, and specific patterns 102 arranged according to a desired array of the multiple beams. Here, the specific patterns 102 are indicated by alphabets, and the example is an adjustment pattern in the case where the multiple beams are constituted by 25 primary beams, and therefore, the alphabets a to y are arranged so that the alphabets a to y become positions of the primary beams obtained by rotating the array of the multiple beams by a predetermined angle.

Even in the case of the continuous scanning method, (1) if the position of the specific pattern is at the center of the SEM image 103, it can be determined that the array of the multiple beams is appropriately rotated, (2) if the dots are arranged to be perpendicular and parallel to the SEM image 103, it can be determined that the scanning direction is appropriate, and (3) if a specified number of dots appear in both the X direction and the Y direction in the SEM image 103, it can be determined that the scanning width is appropriate.

REFERENCE SIGN LIST

1: electron source, 2: collimator lens, 3: aperture array, 4: lens array, 5: beam separator, 6: rotation lens, 7: deflector, 8: objective lens, 10: sample, 11: stage, 12: standard sample, 15: detector, 17: control unit, 18: monitor, 20: primary beam, 22: electron source image, 30, 40, 41, 42, 43, 44, 45, 46, 47, 48: unit field of view, 31: field of view, 60, 100: adjustment pattern, 61, 101: dot pattern, 62, 102: specific pattern, 63, 103: SEM image, 70: GUI screen, 92, 94, 97: band-shaped region.

The invention claimed is:

1. A charged particle beam device comprising:
   a stage on which a sample is mounted;
   a charged particle optical system configured to irradiate the sample with multiple beams including multiple primary beams;
   a detector configured to detect secondary beams generated by interactions between the primary beams and the sample and output detection signals; and
   a control unit configured to control the stage and the charged particle optical system to generate image data based on the detection signals from the detector obtained by scanning the sample with the multiple beams using a first scanning method, wherein
   the control unit is configured to change, when abnormality of the multiple beams is determined based on the image data, the multiple beams to scan the sample using a second scanning method, and
   a scanning width of the multiple beams for scanning the sample is greater in the second scanning method than in the first scanning method.

2. The charged particle beam device according to claim 1, wherein
   the second scanning method is further different from the first scanning method in a scanning direction in which the multiple beams scan the sample, or an array of the multiple beams is rotated.

3. The charged particle beam device according to claim 2, wherein
   the charged particle optical system includes a deflector configured to deflect the multiple beams and a rotation lens configured to rotate and project an electron source image of the primary beams constituting the multiple beams; and
   the control unit is configured to change the scanning width or the scanning direction by controlling the deflector, and control the rotation lens to rotate the array of the multiple beams.

4. The charged particle beam device according to claim 1, wherein
   the control unit is configured to integrate unit fields of view of the primary beams constituting the multiple beams obtained by scanning the sample with the multiple beams using the second scanning method, and cut out a region corresponding to a field of view obtained by scanning the sample with the multiple beams using the first scanning method.

5. The charged particle beam device according to claim 4, wherein
   the control unit is configured to correct distortion caused by an increase of the scanning width when the unit fields of view of the primary beams constituting the multiple beams are integrated.

6. The charged particle beam device according to claim 4, wherein
   the control unit is configured to integrate the unit fields of view of the primary beams constituting the multiple beams so that there is no difference in brightness due to overlap of the unit fields of view of the primary beams constituting the multiple beams.

7. The charged particle beam device according to claim 1, wherein
the control unit is configured to determine the abnormality of the multiple beams based on an image quality of the image data of the unit fields of view of the primary beams constituting the multiple beams obtained by scanning the sample with the multiple beams using the first scanning method.

8. An inspection method using a charged particle beam device, the charged particle beam device including a stage on which a sample is mounted, a charged particle optical system configured to irradiate the sample with multiple beams including multiple primary beams, a detector configured to detect secondary beams generated by interactions between the primary beams and the sample and output detection signals, and a control unit configured to control the stage and the charged particle optical system to generate image data based on the detection signals from the detector obtained by scanning the sample with the multiple beams using a first scanning method, the inspection method comprising:

setting an inspection region to be inspected by the charged particle beam device and an inspection condition including a resolution of a charged particle beam image acquired by the charged particle beam device;

determining, when abnormality of the multiple beams is determined based on the image data, whether the charged particle beam image acquired by changing the multiple beams to scan the sample using a second scanning method satisfies a resolution condition set as the inspection condition; and performing a relief of a beam defect by setting a scanning method of the multiple beams as the second scanning method when the resolution condition is satisfied and setting the scanning method of the multiple beams as the first scanning method when the resolution condition is not satisfied, wherein a scanning width of the multiple beams for scanning the sample is greater in the second scanning method than in the first scanning method.

9. The inspection method according to claim 8, wherein the second scanning method is further different from the first scanning method in a scanning direction in which the multiple beams scan the sample, or an array of the multiple beams is rotated.

10. The inspection method according to claim 8, wherein in the relief of the beam defect, when the resolution condition is satisfied, unit fields of view of the primary beams constituting the multiple beams obtained by scanning the sample with the multiple beams using the second scanning method are integrated, and a region corresponding to a field of view obtained by scanning the sample with the multiple beams using the first scanning method is cut out to obtain a charged particle beam image.

11. The inspection method according to claim 8, wherein in the relief of the beam defect, when the resolution condition is not satisfied, after the sample is scanned with the multiple beams using the first scanning method, a unit field of view of a primary beam having the beam defect is scanned with a primary beam without the beam defect to obtain a charged particle beam image.

12. The inspection method according to claim 9, wherein a standard sample on which an adjustment pattern is formed is mounted on the stage, and
when the second scanning method is performed, the scanning width, the scanning direction, or the array of the multiple beams is adjusted using the adjustment pattern.

13. The inspection method according to claim 8, wherein a unit inspection region is set for the sample, and
the abnormality of the multiple beams is determined each time inspection of the unit inspection region is completed.

14. The inspection method according to claim 13, wherein the abnormality of the multiple beams is determined based on image quality of the image data of the unit fields of view of the primary beams constituting the multiple beams obtained by scanning the sample with the multiple beams using the first scanning method.

15. The inspection method according to claim 8, wherein an inspection report displays presence or absence of the abnormality of the multiple beams.

* * * * *